PURE FLUID INTEGRATOR

Filed Nov. 30, 1964

INVENTORS
BJORN G. BJORNSEN
THOMAS J. LECHNER JR.
PAUL H. SORENSON
BY Andrus & Starke
Attorneys United States Patent Office 3,294,319
Patented Dec. 27, 1966

3,294,319
PURE FLUID INTEGRATOR

Bjorn G. Bjornsen, Milwaukee, Thomas J. Lechner, Jr., Menomonee Falls, and Paul H. Sorenson, West Allis, Wis., assignors to Johnson Service Company, Milwaukee, Wis., a corporation of Wisconsin
Filed Nov. 30, 1964, Ser. No. 414,812
6 Claims. (Cl. 235—200)

Figures 1, 2:
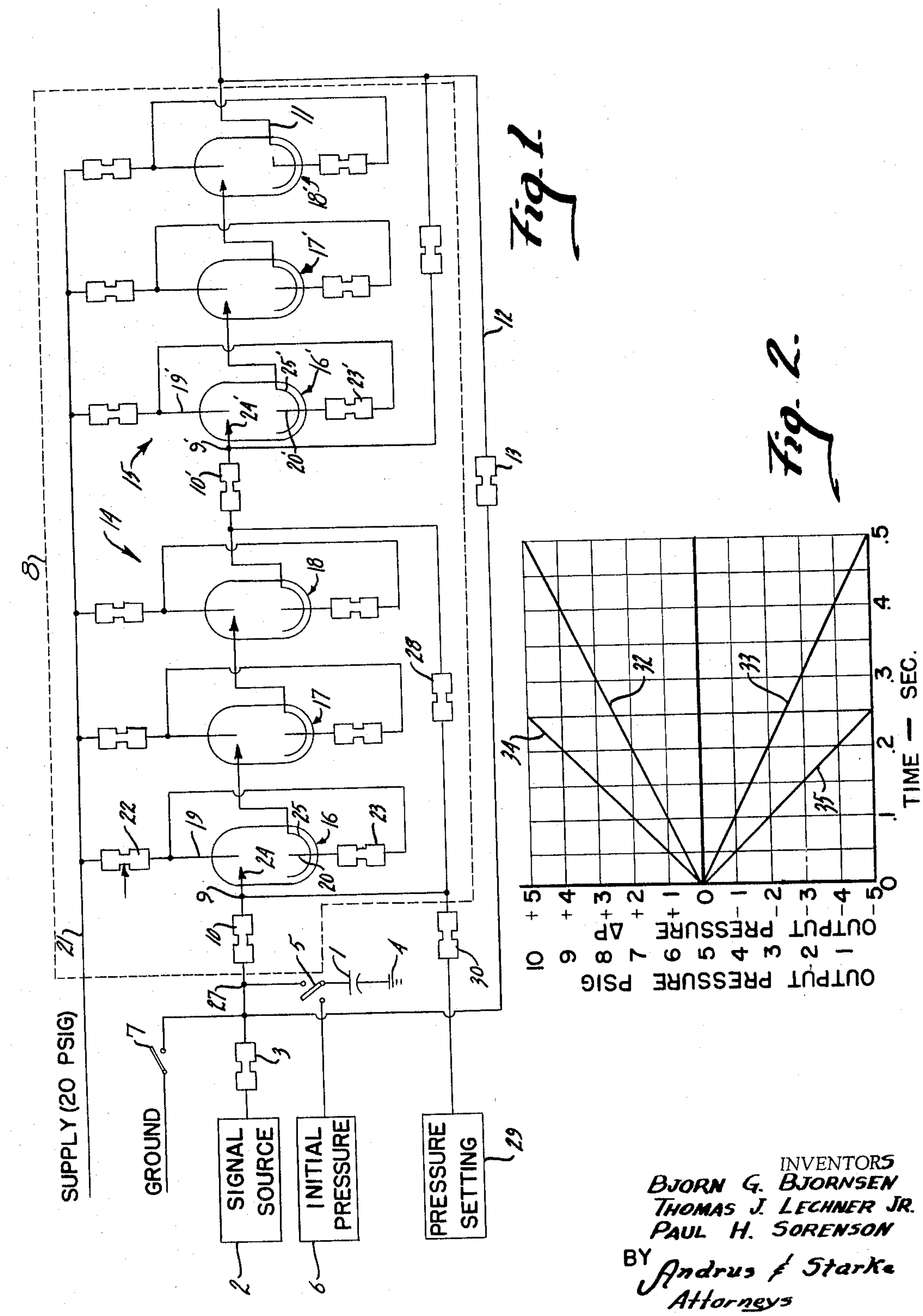

This invention relates to a pure fluid integrator for producing a time integral of a fluid signal.

This invention particularly relates to pure fluid operating systems which utilize the flow of interacting fluid streams or jets to produce a fluid output signal. Such systems have been constructed to function analogously to electronic systems.

However, pure fluid amplifiers differ from electronic amplifiers in that the fluid amplifier is generally a low input impedance unit whereas the electronic amplifier is a high input impedance unit. Applicants' copending application Serial Number 414,808, entitled Pure Fluid Operational Amplifier, filed November 30, 1964, discloses a pure fluid operational amplifier which will function in a manner analogous to electronic devices. As set forth therein, the amplifier is biased to operate at a level to increase its input impedance and particularly includes a set point modulator for increasing the pressure operating level to a proper level.

A pneumatic control or computing system, similar to an electronic control, may require an output signal proportional to the time integral of a fluid input signal. The present invention is thus directed to a pure fluid integrator which provides an output which is an accurate integration of an input signal or signals and particularly to a pure fluid "boot-strap" integrator. Accordingly, a fluid storage capacitor and a restrictor are connected to receive an input signal and to apply the pressure signal to a pure fluid operational amplifier having a positive gain. A suitable feedback circuit is provided which compensates for the RC behavior of the input signal as it is applied to the capacitor and the operational amplifier. Thus, the increasing pressure in the fluid capacitor generates a counter pressure which opposes the incoming signal. The feedback circuit provides a compensating signal to overcome the opposing force of the fluid capacitor. By proper selection of the amplifier gain the resulting pressure across the capacitor and therefore the amplifier output signal pressure will be proportional to the time integral of the input signal. Means are also interconnected to the input line to connect the capacitive device to reference pressure or to an initial condition which first clears the system and then sets the system to a preselected operating condition.

The present invention provides a pure fluid device which can in a pure fluid control system provide accurate integration of an input signal and thereby provide a signal proportional to the time integral of the input signal.

The drawing furnished herewith illustrates a preferred construction disclosing the several features of the present invention and more fully describes a means for designing a circuit with the necessary fluid restrictors and fluid capacitors to provide true fluid signal integration.

In the drawing, FIG. 1 is a schematic circuit diagram illustrating a pure fluid "boot-strap" integrator in accordance with the present invention; and FIG. 2 is a typical diagram showing the output characteristic of the integrator of the present invention.

Referring to the drawing and particularly to FIG. 1, the illustrated "boot-strap" integrator includes a fluid storage device or capacitor 1 connected to a fluid signal source 2 in series with a restrictor 3 and ground. A valve 5 selectively connects the capacitor 1 to an initial condition source 6 for charging of the capacitor to a selected starting pressure. In order to clear the fluid circuit and permit the establishment of any selected desired condition, a ground valve 7 connects the high side of capacitor 1 directly to a suitable ground or reference.

A pure fluid operational amplifier 8 having a positive gain has an input signal nozzle 9 connected to the high pressure side of the fluid capacitor 1 through an input restrictor 10 and an output signal nozzle 11 where the true time integral of the input signal to the capacitor is generated. A feedback line 12 connects the output of the amplifier 8 to the input of the fluid capacitor 1 and includes a restrictor 13. The signal feedback is selected to add to and boost the input signal by an amount just sufficient to overcome the opposing force of the fluid capacitor 1. The signal at the output signal nozzle 11 will then be an accurate integration of the input signal.

More particularly in the illustrated embodiment of the invention, the fluid amplifier 8 includes two similar cascaded amplifying sections 14 and 15. Each of the sections 14 and 15 is similarly constructed and consequently only section 14 is hereinafter described specifically with section 15 similarly numbered.

The amplifying section 14 is a three stage pure fluid amplifier and includes three transverse impact amplifiers 16, 17 and 18, the operation and a specific example of which is more fully disclosed in applicants' above mentioned copending application entitled Pure Fluid Operational Amplifier and filed herewith. The modulators are schematically shown herein and amplifier 16 is described with corresponding elements of amplifiers 17 and 18 identified by similar primed numbers.

Amplifier 16 includes a pair of opposed main power or stream nozzles 19 and 20 connected to a common supply line 21 in series with a common restrictor 22. A dropping restrictor 23 is connected in the line to nozzle 20 to reduce the strength of the stream from the nozzle by a selected constant. A signal input nozzle 24 is mounted adjacent the main supply nozzle 19 and extends perpendicularly therefrom to direct a control signal stream which impinges upon the adjacent stream from nozzle 19 and deflects it with respect to the opposed stream from nozzle 20. A collector chamber 25 having an output tube or orifice is determined by the signal at the signal orifice 24.

The input restrictor 10 connects the signal nozzle 24 to the capacitor 5 at the error or input summing point 27. A feedback restrictor 28 connects the signal nozzle 24 directly to the output chamber 25 of the third stage 18. In order to produce a true operational amplifier function the input nozzle 24 is also connected to a zero or set point pressure setting source 29 through a suitable series restrictor 30. The source 29 is a set point adjustment which increases the operating point of the amplifier 8 and thereby eliminates or reduces the effect of the input impedance on the functioning of the operational amplifier in accordance with the teaching of applicants' copending application. The set point adjustment also establishes an operating point about which the pressure may vary to provide both positive signal and negative signal integration. The illustrated embodiment of the invention does not employ the special set point modulator of applicants' copending application, as the closed loop gain of the system is relatively low. If for any reason, a much higher loop gain is required, the system can be readily constructed employing the special modulator section.

In operation, the ground valve 7 is closed with the conditioning valve 5 in the normal operating position to connect the system to ground and thereby provide a zero reference. The initial condition is then established by opening the ground valve 7 and turning the initial condition valve 5 to the initial condition line and thereby produce an initial starting condition in the fluid capacitor or storage device. The input signal is then applied to the common point 27 through its restrictor 3 to charge the device 1 and simultaneously apply the increasing charge to amplifier 8. The flow at the common input terminal or error junction may be summed and the following output signal formula derived:

$$p_o = \frac{A}{R_iC_s + \left(\frac{R_i}{R_L} + \frac{R_i}{R_2} + 1 - \frac{R_i}{R_2}A\right)} p_i$$

A is the amplifier gain, $p_i$ is the input signal pressure, $R_i$ is the impedance of the input restrictor 3, C is the volume of the fluid storage capacitor divided by the product of the mean pressure absolute and the ratio of specific heats, $s$ is the Laplacian operator, $R_L$ is the input impedance of the amplifier and $R_2$ is the impedance of the feedback restrictor 13. True integration is obtained when the second term in the denominator in the above equation is reduced to zero. This requires that the gain A be positive and equal to one plus the ratio of the impedances of the feedback and input restrictors plus the ratio of the impedances of the feedback and load restrictors. This is obtained by cascading two negative gain amplifying sections 14 and 15 with the product of their gains being equal to the gain A. The positive gain is obtained by the use of two negative gain amplifying sections 14 and 15. The equation then reduces to $$p_o = \frac{(A)}{(R C)} \int_0^t p_i d_t$$

which is the definition of a true integrator. In the actual construction of a boot strap integrator, as diagrammatically shown in FIG. 1, the main supply pressure at line 21 was set at twenty pounds per square inch gauge. A five pounds per square inch gauge reference signal was used to represent zero so that positive and negative integration could be accomplished. The closed loop gain of the amplifier pair was 4.0 and the several restrictors had the following values:

Restrictor $3 = 7 \times 10^6$ pounds force-second per foot$^5$ (# f. sec./ft.$^5$)
Restrictor 10 (section 14) $= 5 \times 10^6$ # f. sec./ft.$^5$
Restrictor 10 (section 15) $= 10 \times 10^6$ # f. sec.ft./$^5$
Restrictor 28 (section 14) $= 10 \times 10^6$ # f. sec./ft.$^5$
Restrictor 28 (section 15) $= 20 \times 10^6$ # f. sec./ft.$^5$
Restrictor $13 = 9 \times 10^6$ # f. sec./ft.$^5$
Restrictor $30 = 20 \times 10^6$ # f. sec./ft.$^5$ The response of the fluid integrator to several stepped input fluid signals is graphically shown in FIG. 2. The ouput pressure with respect to the five pound reference signal and the change of the output pressure with respect thereto is illustrated on the vertical scale. Time is shown on the horizontal axis. Both a positive and negative one pound per square inch step generated similarly opposite diverging graph lines 32 and 33 each of which is a true time integral of the input signal. Similarly, positive and negative signals of 2 pounds per square inch step produced similar diverging graph lines 34 and 35 of an increased slope showing the increased integral of the input.

FIG. 2 clearly shows the accuracy of integration of an integrator constructed in accordance with the present invention.

The integrator is very stable and capable of driftless operation with a zero input signal for substantial periods.

The present invention thus provides a reliable and simple means for providing pure fluid integration of an input signal.

Various modes of carrying out the invention are contemplated as being within the scope of the following claims particularly pointing out and distinctly claiming the subject matter which is regarded as the invention.

We claim:

1. A purse fluid integrator, wherein
   a forward gain amplifier includes a plurality of cascaded impact modulators each of which includes a pair of opposed impacting main streams and a transverse control stream engaging the input main stream for controlling the recovery of the impacting streams, said amplifier including feedback restrictor means to produce a pure fluid operational amplifier,
   a fluid input restrictor connected to the first stage of the amplifier,
   a feedback restrictor connected between said input restrictor and the output of the amplifier,
   a signal source restrictor connected to said input restrictor, and
   a fluid capacitor connected between a reference and said input restrictor.

2. The pure fluid integrator of claim 1 wherein said forward gain amplifier includes a pair of cascaded operational amplifiers each of which includes a sufficient number of said impact modulators to define a negative feedback characteristic, and a set point pressure source connected to first operational amplifier to produce an elevated zero reference to provide both positive and negative signal integration.

3. A pure fluid integrator which comprises,
   a pair of cascaded operational amplifiers having negative feedback and defining an input terminal and an output terminal and each of which includes a plurality of impact modulators having opposed impacting streams at least some of which are controlled by an input transverse control stream,
   a feedback restrictor connected between the output of the amplifier and the input of the amplifier, each of the operational amplifiers having a selected input restrictor,
   a feedback restrictor connected between the input terminal and the output terminal,
   a signal source restrictor connected to said input terminal, and
   a fluid capacitor connected between the input terminal and a common fluid reference.

4. The pure fluid integrator of claim 3 having a set point pressure source connected to the output side of the input restrictor of the first operational amplifier to produce an elevated zero reference and permit both positive and negative signal integration.

5. The pure fluid integrator of claim 3 having an initial pressure setting source,
   valve means to selectively connect said capacitor to said initial pressure setting source and said input terminal, and
   a pressure reference means selectively connected to said input capacitor.

6. In a pure fluid integrator,
   a multi-stage pure fluid amplifier having positive gain, said amplifier including a plurality of impact modulators one of which constitutes a first stage and includes a pair of opposed impacting streams,
   a fluid input restrictor connected to the first stage of the amplifier, said first stage having means for forming a control stream connected to the output side of said input restrictor and transversely impinging on one of the impacting streams,
   a feedback restrictor connected between said input restrictor and the output of the amplifier,
   a signal source restrictor connected to said input restrictor, an initial pressure setting source,
a fluid capacitor, and
valve means to selectively connect said capacitor to said initial pressure setting source and said input restrictor.

References Cited by the Examiner

UNITED STATES PATENTS

| | | | |
|---|---|---|---|
| 3,151,623 | 10/1964 | Riordan | 235—201 X |
| 3,155,825 | 11/1964 | Boothe | 235—201 |

FOREIGN PATENTS

| | | |
|---|---|---|
| 1,164,122 | 2/1964 | Germany. |

OTHER REFERENCES

Korn and Korn: Electronic Analog Computers, McGraw-Hill, 1956, pages 171–189 and 345–349 relied on.

RICHARD B. WILKINSON, *Primary Examiner.*

LEO SMILOW, *Examiner.*

WAYNE F. BAUER, *Assistant Examiner.*